United States Patent [19]

Ray et al.

[11] 4,232,057
[45] Nov. 4, 1980

[54] SEMICONDUCTOR PLASMA OXIDATION

[75] Inventors: Asit K. Ray, Mt. Kisco; Arnold Reisman, Yorktown Heights, both of N.Y.

[73] Assignee: International Business Machines Corporation, Armonk, N.Y.

[21] Appl. No.: 16,648

[22] Filed: Mar. 1, 1979

[51] Int. Cl.³ .............................................. B05D 3/06
[52] U.S. Cl. ...................................... 427/39; 204/164
[58] Field of Search ........................... 427/38, 39, 93; 204/164; 118/49.1, 49.5, 50.1

[56] References Cited

U.S. PATENT DOCUMENTS

| | | | |
|---|---|---|---|
| 3,108,900 | 10/1963 | Papp | 427/39 |
| 3,424,661 | 1/1969 | Androshuk et al. | 427/39 |
| 3,485,666 | 12/1969 | Sterling et al. | 427/38 |
| 3,615,956 | 10/1971 | Irving et al. | 156/17 |
| 3,920,483 | 11/1975 | Johnson et al. | 148/1.5 |
| 3,935,328 | 1/1976 | Sugano et al. | 427/38 |
| 4,123,316 | 10/1978 | Tsuchimoto | 204/164 |
| 4,123,663 | 10/1978 | Horiike | 204/164 |
| 4,138,306 | 2/1979 | Niwa | 427/39 |

OTHER PUBLICATIONS

Pulfrey et al., "Solid State Electronics", V. 17, 1974, pp. 627-632.

Primary Examiner—John H. Newsome
Attorney, Agent, or Firm—Alvin J. Riddles

[57] ABSTRACT

Uniform growth of oxide at low temperature can be performed in a plasma environment by positioning the substrates on which the oxide is to grow outside of the plasma area and independently supplying heat to the substrates in the presence of controlled oxygen pressure.

4 Claims, 4 Drawing Figures

SEMICONDUCTOR PLASMA OXIDATION

DESCRIPTION

1. Technical Field

The technical field of the invention is the formation of oxides on semiconductor substrates in the process of the fabrication of integrated circuits.

Oxidation of semiconductor substrates has been performed thermally in either wet or dry ambients and under these circumstances, the oxide growth rate has not been uniform in that there is exhibited a small linear growth behavior followed by a behavior that is essentially parabolic in nature.

When the goals of ultramicrominiaturization begin to become in reach, conventional processes of thermal oxidation become increasingly untenable because at the elevated temperatures that are involved in the developing complex structures, the semiconductor device impurity profiles become redistributed and this in turn impacts device designs significantly.

An effort has been underway to find an oxidizing technique that can be practiced at lower temperatures, preferably below 700° C. at which impurity diffusion coefficients become very small.

2. Background Art

The art of plasma formation of oxide on semiconductors has been referred to as plasma growth, as plasma oxidation, or under circumstances where the semiconductor substrate is part of the anode electrode, the process is called plasma anodization. In the article in *Solid State Electronics,* Vol. 17, p. 627, 1974 oxide formation at constant current and pressure with no control of temperature is reported.

There is, however, a need in the art for a simplified low temperature plasma growth technique which provides uniform reproducible oxide of similar electrical and physical characteristics to those obtained in high temperature thermal processes.

DISCLOSURE OF INVENTION

The technique of the invention provides plasma oxide formation by positioning the semiconductor substrate outside of the plasma region, by providing independent and controllable heat to the substrate and by providing independent oxygen pressure control to the container or the apparatus.

The growth rate increases with increasing power and decreases with increasing pressure. The reproducibility of the oxide thickness is within 2-4%.

BEST MODE FOR CARRYING OUT INVENTION

Figure 1:
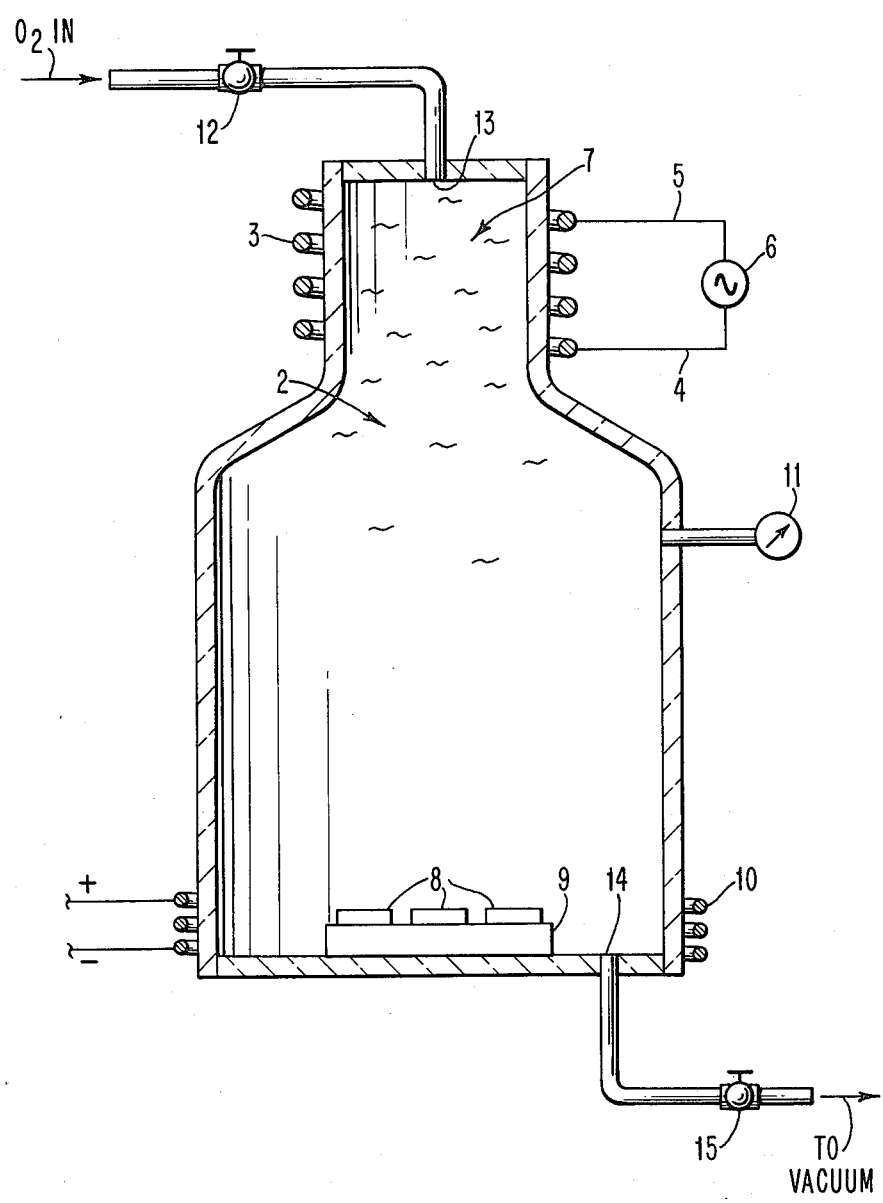
FIG. 1 is a view of an apparatus for practice of the invention illustrating the parameters for control.

Referring to FIG. 1, an illustrative type of apparatus for practice of the invention is shown. In FIG. 1 a container 1 is shown which can be evacuated and then a controlled amount of oxygen 2 is flowed through the system at a controlled pressure. The container 1 has provision in it for plasma generation consisting of induction coil 3 connected by appropriate conductors 4 and 5 to a variable power radio frequency generator providing thereby a plasma region 7 wherein the controlled ambient atmosphere 2 is ionized using radio frequency excitation.

Semiconductor substrates 8 are positioned on a holder 9 which is equipped with an independent heating source 10. The ambient atmosphere 2 is maintained at a precise pressure as indicated by guage 11 and a flow is supplied from a source labelled $O_2$ through a valve 12 entering the container 1 at a port 13 and exhausting to a vacuum at port 14 through valve 15.

In accordance with the invention, low temperature oxide growth is provided by independent temperature and pressure control. This is accomplished through the providing of the separate substrate temperature supply 10 and location separated from the plasma region 7 and by plasma variable power control through the radio frequency source 6.

In this structure no electrode sputtering nor electrode contamination will occur.

The position of the substrates 8 is such that the excited oxygen under the small pressure differential that exists can drift from the plasma region 7 to the substrates. The substrates 8 are preferably about 20 centimeters from the center of the induction coil 3. Further, the substrates 8 are heated independently and controllably through the resistance heater 10. Under these conditions the active oxygen species that results in the oxide growth drifts from the plasma region 7 to the substrates 8.

In the case of substrate material of silicon, using the controls 12 and 15 schematically illustrated in connection with the oxygen supply, a pressure range of the ambient atmosphere 2 as indicated by the schematic guage 11, preferably in the vicinity of less than 3 mtorr is maintained.

In a preferred example, for the substrate material silicon, the materials of the system of FIG. 1 are quartz and the purification of the oxygen introduced through the port 13 is effected using a standard high temperature 1000° C. quartz decomposition tube followed by a liquid nitrogen trap.

The substrates 8 are maintained by the heating element 10 in the vicinity of 300°-800° C. and the substrates may either be oxide free or in the alternative may already have any amount such as 120-300 nanometers of thermal oxide already in place.

As a result, in accordance with the invention, of providing independent controls for pressure, power and temperature the growth rate may be varied from a few nanometers per hour to a few hundred nanometers per hour independently of the temperature in the range of approximately 300°-800° C.

Figure 2:
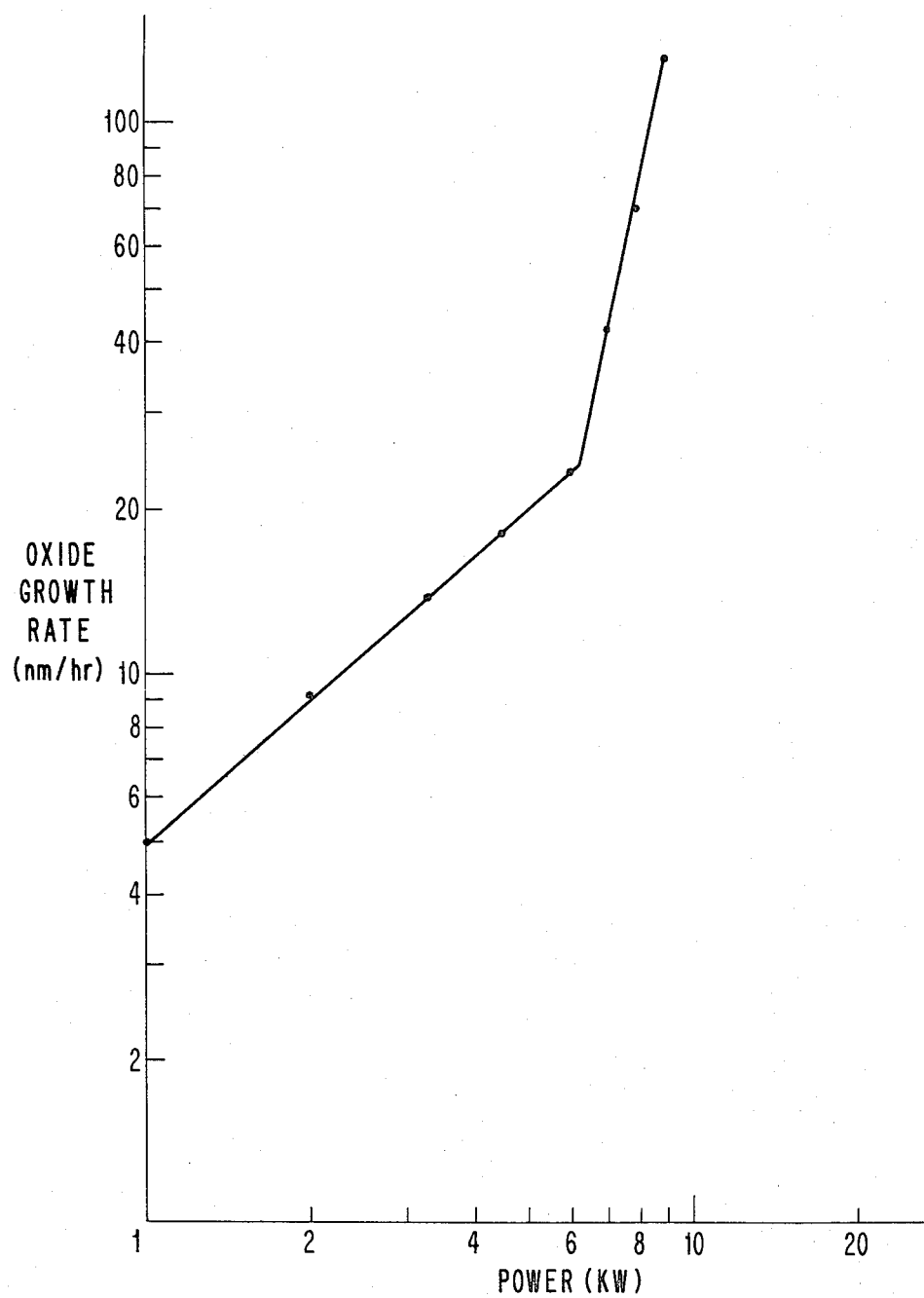
FIG. 2 is a graph of the variation of oxide growth rate with power.

The responsiveness of the system for the growth rate of oxide in this temperature and pressure range as a function of power is shown in FIG. 2. The growth rate at 650° C. and 2.5 mtorr, for example, as shown in FIG. 2 is seen to vary linearly with power input in the range from 1 to 6 kilowatts and to the 4.5 power of the power input above 6 kilowatts.

Figure 3:
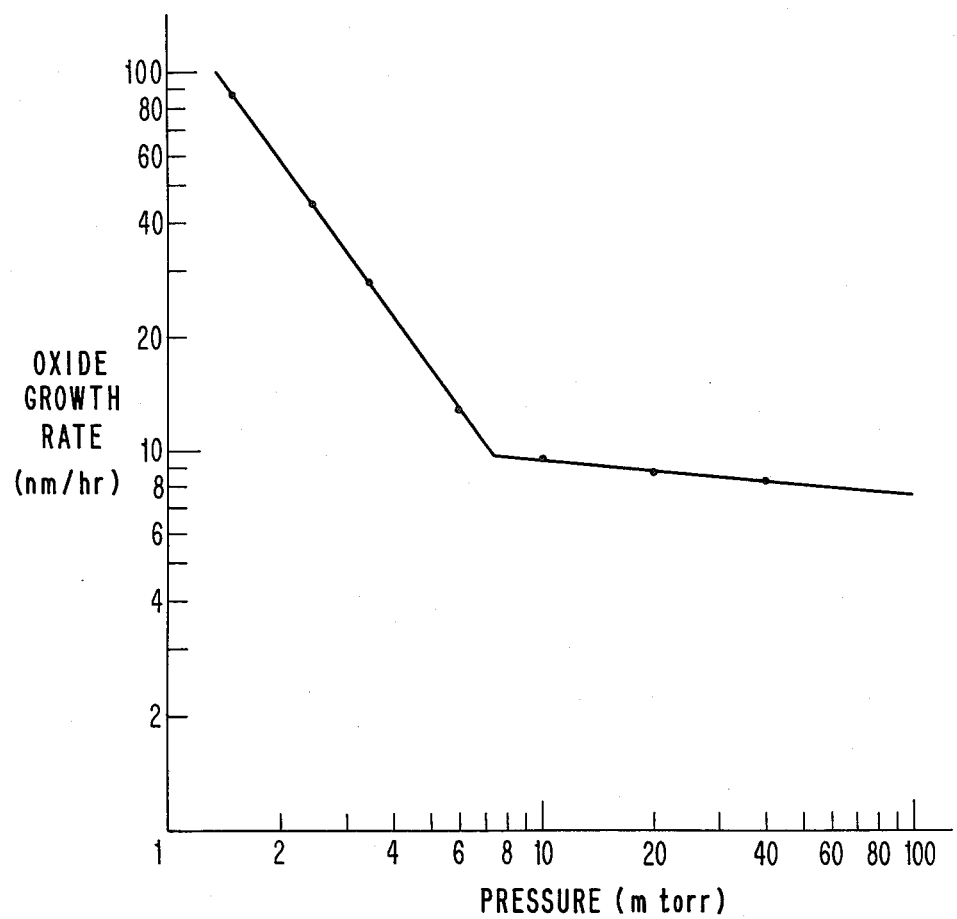
FIG. 3 is a graph of the variation of oxide growth rate with pressure.

FIG. 3 shows the dependence of growth rate on pressure for the example temperature of 650° C. and power 7 KW, it being understood that the same dependence is present for all temperatures in the range from approximately 300° C. to 800° C.

Figure 4:
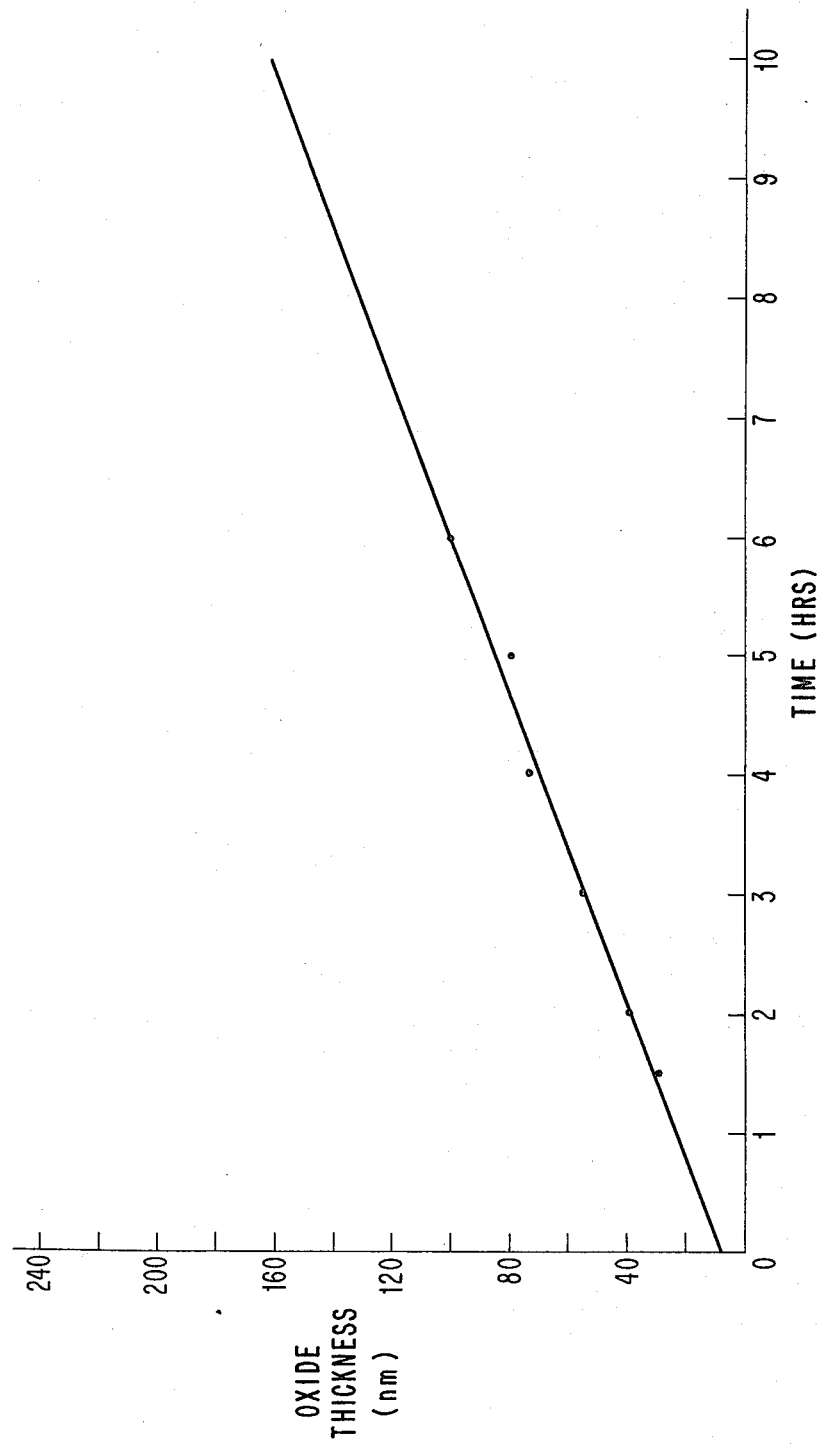
FIG. 4 is a graph of the variation of oxide thickness with time.

FIG. 4 shows the variation of oxide thickness with time at 650° C. at 2.5 mtorr.

The oxide growth in the system described in accordance with the invention continues indefinitely and always exhibits a variation linear behavior with time indicative of a surface limited reaction process. The oxide growth over the area of an example 2¼" diameter wafer exhibits only a 2-4% thickness variation with a refractive index and breakdown strength that are comparable to those of dry thermal oxide grown at 1000°-1100° C.

What has been described is a technique of providing low temperature uniform plasma oxide formation by positioning the substrate outside of the plasma region which has independent plasma power control and oxygen flow rate and pressure control and providing independent substrate temperature control.

Having described the invention, what is claimed as new and what is desired to secure by Letters Patent is:

1. The process of linear plasma oxide growth on semiconductor substrates comprising in combination the steps of:
   providing a container having a separated plasma generation location and an oxide growth location,
   maintaining in said container an oxygen ambient at a pressure in a range of less than 40 millitorr,
   applying power external to said container adjacent to said plasma generation location sufficient to form a plasma of said oxygen, and
   maintaining a substrate temperature in the range of 300° to 800° C. with a temperature source external to said container adjacent to said oxide growth location.

2. The process of claim 1 wherein said semiconductor material is silicon.

3. The process of claim 2 wherein the separation between said plasma generation location and said growth location is in the range of 20 centimeters.

4. The process of claim 3 wherein said pressure is in a range of less than 10 millitorr.